(12) United States Patent
Xu et al.

(10) Patent No.: US 11,967,620 B2
(45) Date of Patent: Apr. 23, 2024

(54) THIN FILM TRANSISTOR, METHOD OF MANUFACTURING THE SAME AND DISPLAY DEVICE

(71) Applicant: BOE Technology Group Co., Ltd., Beijing (CN)

(72) Inventors: Pan Xu, Beijing (CN); Yicheng Lin, Beijing (CN); Cuili Gai, Beijing (CN); Ling Wang, Beijing (CN); Yongqian Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 90 days.

(21) Appl. No.: 17/682,239

(22) Filed: Feb. 28, 2022

(65) Prior Publication Data

US 2022/0181454 A1   Jun. 9, 2022

Related U.S. Application Data

(63) Continuation of application No. 16/613,690, filed as application No. PCT/CN2019/087606 on May 20, 2019, now abandoned.

(30) Foreign Application Priority Data

Jun. 6, 2018 (CN) .......................... 201810579157.2

(51) Int. Cl.
*H01L 29/417* (2006.01)
*H01L 27/12* (2006.01)
(Continued)

(52) U.S. Cl.
CPC ...... *H01L 29/41733* (2013.01); *H01L 27/127* (2013.01); *H01L 29/66969* (2013.01);
(Continued)

(58) Field of Classification Search
CPC ........... H10K 59/1213; H10K 59/1216; H10K 59/126; H10K 59/131
See application file for complete search history.

(56) References Cited

U.S. PATENT DOCUMENTS 10,192,935 B2   1/2019 Shim et al.
10,326,095 B2 *  6/2019 Kang ................... H10K 59/126
(Continued)

FOREIGN PATENT DOCUMENTS

CN   101017843 A   8/2007
CN   103762245 A   4/2014
(Continued)

OTHER PUBLICATIONS

First Office Action, including Search Report, for Chinese Patent Application No. 201810579157.2, dated Mar. 16, 2020, 15 pages.
(Continued)

*Primary Examiner* — Peter M Albrecht
(74) *Attorney, Agent, or Firm* — Westman, Champlin & Koehler, P.A.

(57) ABSTRACT

Embodiments of the present disclosure provide a thin film transistor, a method of manufacturing the same, and a display device. The thin film transistor includes a metal conductive pattern layer, an interlayer insulating layer, and a metal oxide layer; and the metal conductive pattern layer includes: a light shielding pattern, a source signal line, and/or a drain signal line; the metal oxide layer includes: a source electrode, a drain electrode, and an active layer. An orthographic projection of the active layer on the base substrate has an overlapping region with that of the light shielding pattern; the source electrode extends through the interlayer insulating layer to connect to the source signal line, and/or the drain electrode extends through the interlayer insulating layer to connect to the drain signal line.

10 Claims, 6 Drawing Sheets

(51) Int. Cl.
  *H01L 29/66* (2006.01)
  *H01L 29/786* (2006.01)
  *H10K 59/121* (2023.01)
  *H10K 59/126* (2023.01)
  *H10K 59/131* (2023.01)
  *H01L 21/44* (2006.01)

(52) U.S. Cl.
  CPC .. *H01L 29/78618* (2013.01); *H01L 29/78633* (2013.01); *H10K 59/1216* (2023.02); *H10K 59/126* (2023.02); *H10K 59/131* (2023.02); *H01L 21/44* (2013.01); *H01L 29/7869* (2013.01)

(56) References Cited

U.S. PATENT DOCUMENTS

| | | |
|---|---|---|
| 2014/0167040 A1 | 6/2014 | Lee et al. |
| 2015/0187860 A1 | 7/2015 | Seo et al. |
| 2017/0090229 A1 | 3/2017 | Imai et al. |
| 2017/0294464 A1 | 10/2017 | Kwon |
| 2018/0061908 A1 | 3/2018 | Shim et al. |
| 2018/0323347 A1 | 11/2018 | Liu |
| 2019/0164999 A1* | 5/2019 | Choi .................. H10K 59/131 |
| 2020/0381524 A1 | 12/2020 | Xu et al. |

FOREIGN PATENT DOCUMENTS

| | | |
|---|---|---|
| CN | 107424935 A | 12/2017 |
| CN | 107799556 A | 3/2018 |
| CN | 108550553 A | 9/2018 |

OTHER PUBLICATIONS

U.S. Patent Office issued prosecution for U.S. Appl. No. 16/613,690, filed Nov. 14, 2019, including: Non-Final Rejection dated Nov. 26, 2021, 8 pages; Final Rejection dated Jul. 22, 2021, 7 pages; Non-Final Rejection dated Apr. 9, 2021, 9 pages; Requirement for Restriction/Election dated Jan. 15, 2021, 9 pages; 33 pages total.

* cited by examiner

THIN FILM TRANSISTOR, METHOD OF MANUFACTURING THE SAME AND DISPLAY DEVICE

CROSS-REFERENCE TO RELATED APPLICATION

This application is a continuation application of U.S. patent application Ser. No. 16/613,690, filed Nov. 14, 2019, which published as U.S. Publication No. 2020/0381524, on Dec. 3, 2020, which is a Section 371 National Stage application of International Application No. PCT/CN2019/087606, filed on 20 May 2019, and claims priority to Chinese Patent Application No. 201810579157.2, titled by "Thin film transistor, method of manufacturing the same and display device" and filed on Jun. 6, 2018, the whole disclosures of which are incorporated herein by reference.

TECHNICAL FIELD

Embodiments of the present disclosure relate to technical field of thin film transistor, and particularly to a thin film transistor, a method of manufacturing the same and a display device.

DESCRIPTION OF RELATED ART

As a common electronic device, thin film transistor has been widely used in, particularly, the field of display in recent years. With development of industrialization, simplifying the process and improving yield are main ways to reduce product cost.

A thin film transistor (especially channel location) is very sensitive to light, and is prone to low stability due to light illumination, resulting in low product stability. As an example, a thin film transistor is used in Organic Light Emitting Diode (OLED) display device, particularly is used as a driving thin film transistor in a pixel driving circuit of the OLED display device. Its characteristics are directly related to display brightness (display quality) of the OLED display device. Thus, it is required that optical stability of a thin film transistor is high.

There is a need to further improve the performance of existing thin film transistors and display devices.

SUMMARY

Embodiments of the present disclosure provide a thin film transistor, a method of manufacturing the same and a display device.

An aspect of the present disclosure provides a thin film transistor, including: a metal conductive pattern layer disposed on a base substrate; and, an interlayer insulating layer, a metal oxide layer, a gate insulating layer, and a gate electrode, which are sequentially disposed on the base substrate having the metal conductive pattern layer; wherein the metal conductive pattern layer includes: a light shielding pattern, a source signal line, and/or a drain signal line; the metal oxide layer includes a source electrode, a drain electrode, and an active layer between the source electrode and the drain electrode and being in direct contact with the source electrode and the drain electrode; an orthographic projection of the active layer on the base substrate has an overlapping region with an orthographic projection of the light shielding pattern on the base substrate; the source electrode extends through the interlayer insulating layer to connect to the source signal line, and/or the drain electrode extends through the interlayer insulating layer to connect to the drain signal line.

In an embodiment, the orthographic projection of the light shielding pattern on the base substrate covers the orthographic projection of the active layer on the base substrate.

In an embodiment, the light shielding pattern is connected to the source signal line; or the light shielding pattern is connected to the drain signal line.

In an embodiment, the active layer is made of a metal oxide constituting the metal oxide layer, and the source electrode and the drain electrode include a metal that is transformed from the metal oxide by a conductor transforming process.

Another aspect of the present disclosure provides an array substrate comprising the thin film transistor as mentioned above.

In an embodiment, the array substrate is an OLED array substrate; and a sub-pixel of the array substrate includes a pixel driving circuit; wherein the pixel driving circuit includes: a driving transistor, and an organic light emitting diode connected to a source electrode of the driving transistor; and wherein the driving transistor is the thin film transistor, and a drain electrode of the driving transistor is connected to the drain signal line, and the source electrode of the driving transistor is connected to a first electrode of the organic light emitting diode.

In an embodiment, the pixel driving circuit further comprises a first switching transistor, a second switching transistor, and a storage capacitor; a drain electrode of the first switching transistor is connected to the data line, the source electrode of the first switching transistor is connected to the gate electrode of the driving transistor, and the gate electrode of the first switching transistor is connected to a first gate line; a gate electrode of the second switching transistor is connected to a second gate line, a source electrode of the second switching transistor is connected to a sensing signal line, and a drain electrode of the second switching transistor is connected to the source electrode of the driving transistor; one end of the storage capacitor is connected to the gate electrode of the driving transistor, and the other end is connected to the source electrode of the driving transistor; the source electrode, the drain electrode, and the active layer of the first switching transistor and the source electrode, the drain electrode, and the active layer of the second switching transistor are respectively made of a same material and located in a same layer as the source electrode, the drain electrode, and the active layer of the driving transistor; and the gate electrode of the first switching transistor and the gate electrode of the second switching transistor are both made of a same material and located in a same layer as the gate electrode of the driving transistor.

In an embodiment, the first electrode is a transparent electrode; and the source electrode of the first switching transistor is connected to the gate electrode of the driving transistor through a connection portion, and the connection portion is made of a same material and located in a same layer as the first electrode.

In an embodiment, the source electrode of the driving transistor is connected to the light shielding pattern through the source signal line; the source electrode of the driving transistor and the drain electrode of the second switching transistor constitute an integral electrode, and the integral electrode is connected to the first electrode; and the connection portion extends to a position facing the integral electrode to form the storage capacitor with the integral electrode.

In an embodiment, the data line is located in a same layer and made of a same material as the light shielding pattern of the driving transistor; and/or the first gate line, the second gate line, and the sensing signal line are located in a same layer and made of a same material as the gate electrode of the driving transistor.

A still another aspect of the present disclosure provides a display device comprising the array substrate mentioned above.

A further aspect of the present disclosure provides a method of manufacturing a thin film transistor, wherein the method comprises: forming a metal conductive pattern layer on a base substrate by a patterning process, the metal conductive pattern layer comprising: a light shielding pattern, a source signal line to be connected to a source electrode, and/or a drain signal line to be connected to a drain electrode; forming an interlayer insulating layer on the base substrate on which the metal conductive pattern layer is formed; forming a metal oxide layer on the base substrate on which the interlayer insulating layer is formed; wherein the metal oxide layer includes a source electrode region, a drain electrode region, and an active region between the source electrode region and the drain electrode region and being in direct contact with the source electrode region and the drain electrode region, wherein a portion of the metal oxide layer located in the source electrode region penetrates through the interlayer insulating layer to connect to the source signal line and/or a portion of the metal oxide layer located in the drain electrode region penetrates through the interlayer insulating layer to connect to the drain signal line, and an orthographic projection, on the base substrate, of a portion of the metal oxide layer located in the active region has an overlapping region with an orthographic projection of the light shielding pattern on the base substrate; forming the gate insulating layer and the gate electrode in sequence at a location, corresponding to the active region, of the metal oxide layer; performing a conductor transforming process by a plasma treatment to the source electrode region and the drain electrode region of the metal oxide layer on the base substrate on which the gate electrode is formed, such that a portion, corresponding to the source electrode region, of the metal oxide layer constitutes the source electrode, and a portion, corresponding to the drain electrode region, of the metal oxide layer constitutes the drain electrode, and the active region of the metal oxide layer constitutes the active layer.

Embodiments of the present disclosure provide a thin film transistor, a method of manufacturing the same and a display device. The thin film transistor includes a metal conductive pattern layer disposed on a base substrate; and an interlayer insulating layer, a metal oxide layer, a gate insulating layer, and a gate electrode, which are sequentially disposed on the metal conductive pattern layer; the metal conductive pattern layer includes: a light shielding pattern, a source signal line, and/or a drain signal line; the metal oxide layer includes a source electrode, a drain electrode, and an active layer between the source electrode and the drain electrode and being in direct contact with the source electrode and the drain electrode; an orthographic projection of the active layer on the base substrate has an overlapping region with an orthographic projection of the light shielding pattern on the base substrate; the source electrode extends through the interlayer insulating layer to connect to the source signal line, and/or the drain electrode extends through the interlayer insulating layer to connect to the drain signal line.

BRIEF DESCRIPTION OF THE DRAWINGS

In order to more clearly explain the technical solutions in the embodiments of the present disclosure or those in the related art, the drawings to be used in description of the embodiments or the related art will be briefly described below. Obviously, the drawings in the following description are only some of the embodiments of the disclosure, and others drawings can be obtained based on the disclosed ones by those skilled in the art without departing from the scope of the invention.

DETAILED DESCRIPTION

The technical solutions in the embodiments of the present disclosure are clearly and completely described in the following with reference to the accompanying drawings in the embodiments of the present disclosure. It is obvious that the described embodiments are only some of the embodiments of the present disclosure, and not all of the embodiments. All other embodiments may be obtained by those skilled in the art based on the embodiments of the present disclosure without departing from the inventive scope and belong to the scope of the present disclosure.

Unless otherwise defined, technical terms or scientific terms used in the embodiments of the present disclosure are to be understood as the ordinary meaning of those of ordinary skill in the art. The words "first", "second" and similar terms used in the embodiments of the present disclosure do not denote any order, quantity, or importance, but are merely used to distinguish different components. The word of "include" or "comprise" or the like means that the preceding element or item to the word is intended to cover element(s) or item(s) and equivalent thereof posterior to the word, without excluding other element or item. The word of "connect" or "couple" and the like is not limited to physical or mechanical connections, but may include electrical connections, whether direct or indirect. The words of "upper", "lower", "left", "right", etc. are only used to indicate a relative positional relationship, and when the absolute position of an object to be described is changed, the relative positional relationship may also change accordingly.

Figure 1:
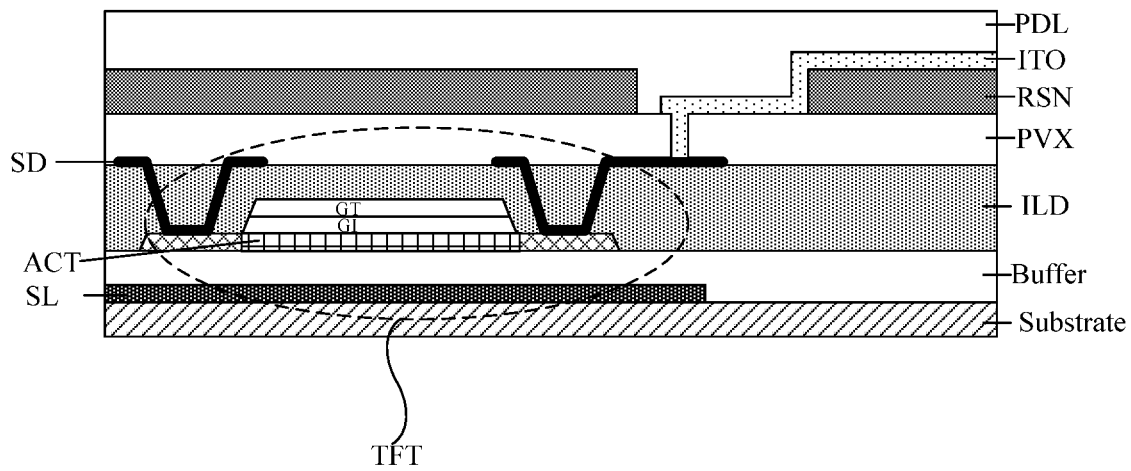
FIG. 1 is a schematic structural diagram of a display device provided in the related art.

The inventors have found that in the prior art, for example, a driving thin film transistor (TFT) of an organic light emitting diode (OLED) display device shown in FIG. 1 is provided, in which a light shielding (SL) layer is generally needed to be separately fabricated under an active layer (ACT) of the TFT to prevent light from entering a channel of the thin film transistor, avoiding decreased optical stability of the TFT.

However, due to separately forming the light shielding layer (SL) under the active layer (ACT) of the TFT, the entire fabrication process in the related art is thus complicated and the number of layers in the OLED display device is increased (prone to cause defects), and thus the number of masks that need to be used for patterning each film layer is consequentially increased. Further, the number of via holes that need to be set increases, which is not conducive to layout design of high pixels-per-inch (PPI) products.

Figure 2:
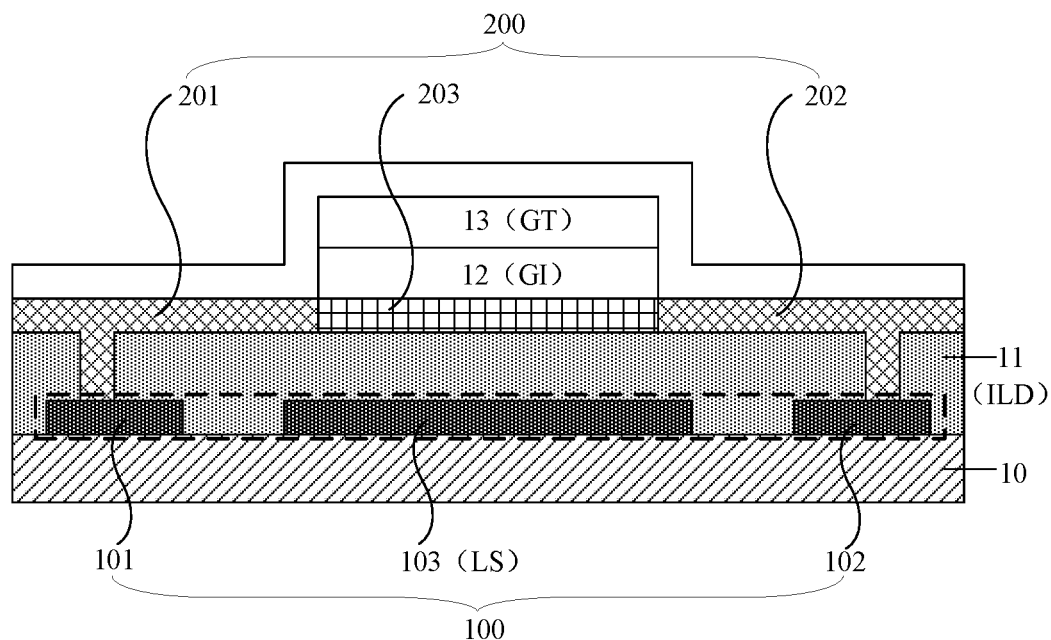
FIG. 2 is a schematic structural diagram of a thin film transistor according to an embodiment of the present disclosure.

Embodiments of the present disclosure provide a thin film transistor, as shown in FIG. 2. The thin film transistor 01 includes: a metal conductive pattern layer 100 on the base substrate 10, and an interlayer insulating layer 11 (ILD), a metal oxide layer 200, a gate insulating layer (GI) 12, and a gate electrode 13 (GT) sequentially disposed on the metal conductive pattern layer 100. Of course, on a side of the gate electrode 13 facing away from the base substrate 10, other film layers such as an insulating layer may be provided according to actual needs.

In the embodiment, the metal conductive pattern layer 100 includes a light shielding pattern 103 (LS), a source signal line 101, and/or a drain signal line 102.

The metal oxide layer 200 includes a source electrode 201, a drain electrode 202, and an active layer 203 located between the source electrode 201 and the drain electrode 202 and being in direct contact with the source electrode 201 and the drain electrode 202; an orthographic projection of the active layer 203 on the base substrate 10 at least partially overlaps an orthographic projection of the light shielding pattern 103 on the base substrate 10, or in other words, the orthographic projection of the active layer 203 on the base substrate 10 has an overlapping region with the orthographic projection of the light shielding pattern 103 on the base substrate 10.

In the present embodiment of the present disclosure, the source electrode 201, the drain electrode 202, and the active layer 203 are in a same layer. During manufacturing, the active layer 203 maintains semiconductor characteristics of the metal oxide under the gate electrode 13 which is used as a shielding while the remained metal oxide is transformed to the source electrode 201 and the drain electrode 202 under a conductor transforming process by implementing plasma. The source electrode 201 and the drain electrode 202 thus include metal obtained through the conductor transforming process and thus possess conductive characteristics. In one embodiment, the metal oxide may be indium gallium zinc oxide (IGZO), but is not limited thereto.

The source electrode 201 extends through an interlayer insulating layer 11 and is connected to the source signal line 101, and/or the drain electrode 202 extends through the interlayer insulating layer 11 and is connected to the drain signal line 102.

In one embodiment, as shown in FIG. 2, the source electrode 201 is connected to the source signal line 101 through a via hole located in the interlayer insulating layer 11, or alternatively, through a non-via hole way, which is not specifically limited herein and other ways may be selected according to actual application. Similarly, the drain electrode 202 penetrates through the interlayer insulating layer 11 to connect to the drain signal line 102.

In the present disclosure, "and/or" is merely used for describing an association relationship between associated objects, and means that there may be three relationships. For example, A and/or B may indicate three cases, that is, A exists separately, and A and B exist at the same time and B exists separately. In addition, the character "/" in this text generally indicates that the contextual objects are of an "or" relationship.

As for the above-mentioned "the source electrode 201 extends through the interlayer insulating layer 11 to connect to the source signal line 101, and/or the drain electrode 202 extends through the interlayer insulating layer 11 to connect to the drain signal line 102", in practical application, as needed, it may chose that the source electrode 201 extends through the interlayer insulating layer 11 to connect to the source signal line 101 or the drain electrode 202 extends through the interlayer insulating layer 11 to connect to the drain signal line 102; or, the source electrode 201 extends through the interlayer insulating layer 11 to connect to the source signal line 101 and the drain electrode 202 extends through the interlayer insulating layer 11 to connect to the drain signal line 102.

Figure 3:
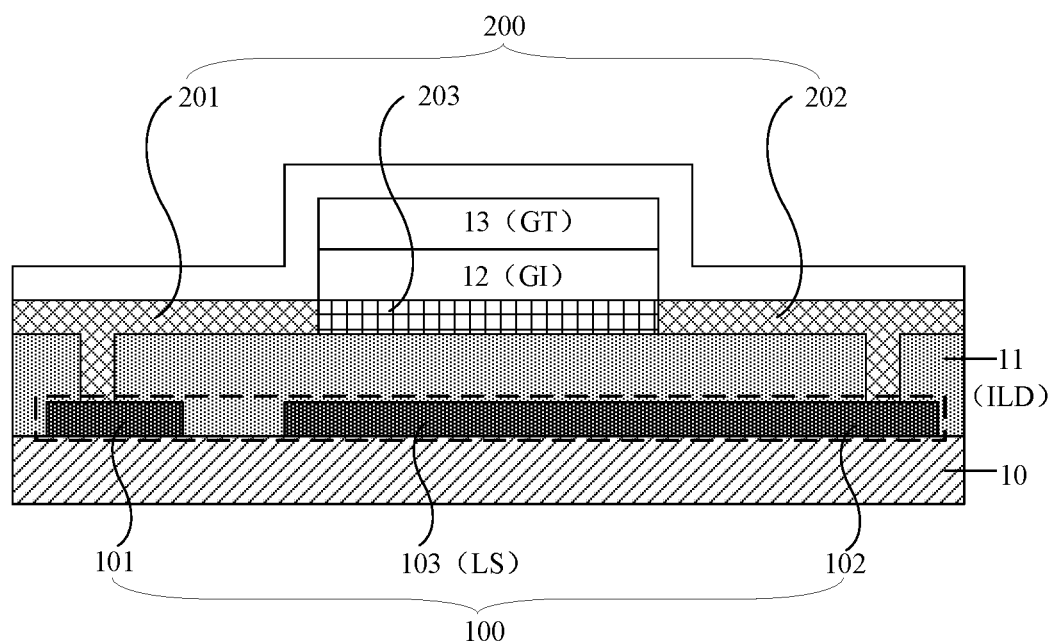
FIG. 3 is a schematic structural diagram of another thin film transistor according to an embodiment of the present disclosure.

In one embodiment, in order to block light from entering the position of the active layer 203 by the light shielding pattern 103 to the greatest extent, as shown in FIG. 2 or FIG. 3, an orthographic projection of the active layer 203 on the base substrate 10 falls within an orthographic projection of the light shielding pattern 103 on the base substrate 10. In other words, the orthographic projection of the light shielding pattern 103 on the base substrate 10 covers the orthographic projection of the active layer 203 on the base substrate 10, that is, the light shielding pattern blocks the light from entering the position of the active layer to the greatest extent. However, this is not necessary.

In one embodiment, in order to prevent the light shielding pattern from being in a floating state during use of the thin film transistor 01, adversely affecting stability of the entire thin film transistor 01, the light shielding pattern 103 is connected to the source signal line 101; or, as shown in FIG. 3, the light shielding pattern 103 is connected to the drain signal line 102. The present disclosure does not specifically limit this, and the connection way for them may be selected according to actual needs. Of course, it should be understood that the light shielding pattern 103, the source signal line 101, and the drain signal line 102 are made of a same material and are located in the same layer. In practice, the light shielding pattern 103 and the source signal line 101 may also be directly disposed as an integral structure, or the light shielding pattern 103 and the drain signal line 102 may be directly disposed as an integral structure (see FIG. 3).

Compared with the related art where the light shielding pattern, the source electrode pattern, the drain electrode pattern, the source signal line and the drain signal line are separately disposed in different layers respectively with respect to interlayer positions, in the embodiments of the present disclosure, the light shielding pattern and the source/drain signal line are disposed in the same layer (for example, they are formed by a single patterning process) to reduce at least one conductive layer (SD layer in FIG. 1) and one insulating layer (Buffer layer in FIG. 1) in the thin film transistor, thereby reducing the number of layers (reducing the number of used masks) and thus simplifying the production process.

In order to prevent the light shielding pattern from being in a floating state, compared with the related art where a plurality of via holes are required (a via hole penetrating the ILD layer and a via hole penetrating the Buffer layer are generally required in FIG. 1) to connect the source signal line or the drain signal line to the light shielding pattern. In the embodiments of the present disclosure, the source signal line and the drain signal line located in the same layer are directly connected to the light shielding pattern, thereby reducing the number of via holes.

In summary, those skilled in the art should understand that when manufacturing a display device, applying the thin film transistor of the embodiment of the present disclosure can reduce layers and the number of via holes on the array substrate in the display device and improve product yield, and further is favor of the layout design of high PPI display products.

In an aspect of embodiments of the present disclosure, an array substrate including the above mentioned thin film transistor is provided.

An aspect of embodiments of the present disclosure further provides a display device including the above mentioned array substrate (i.e., including the foregoing thin film transistor), and thus has the same structure and advantageous effects as the thin film transistor provided by the foregoing embodiments. Since the foregoing embodiments have been described in detail for the structure and advantageous effects of the thin film transistor, they will not be described herein.

It should be noted that, in the embodiments of the present disclosure, the display device may specifically include at least a liquid crystal display panel and an organic light emitting diode display panel, for example, the display panel may be applied to any product or part that has a display function, such as a liquid crystal display, a liquid crystal television, a digital photo frame, a mobile phone, or a tablet computer.

The present disclosure will be further described below in conjunction with an array substrate and a display device.

Figure 4:
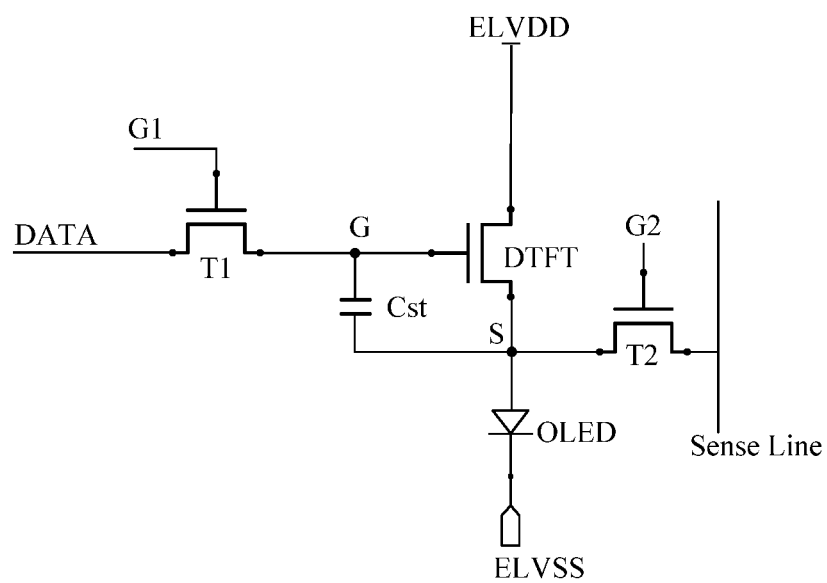
FIG. 4 is a schematic structural diagram of a pixel driving circuit according to an embodiment of the present disclosure.

In an embodiment including an OLED display device, the array substrate is an OLED array substrate, and a sub-pixel of the array substrate includes a pixel driving circuit. As shown in FIG. 4, the pixel driving circuit includes: a driving transistor DTFT, and an organic light emitting diode (OLED) connected to the source electrode of the driving transistor DTFT. The optical stability of the driving transistor DTFT is directly related to the luminance (i.e., display quality) of the OLED.

Figure 5:
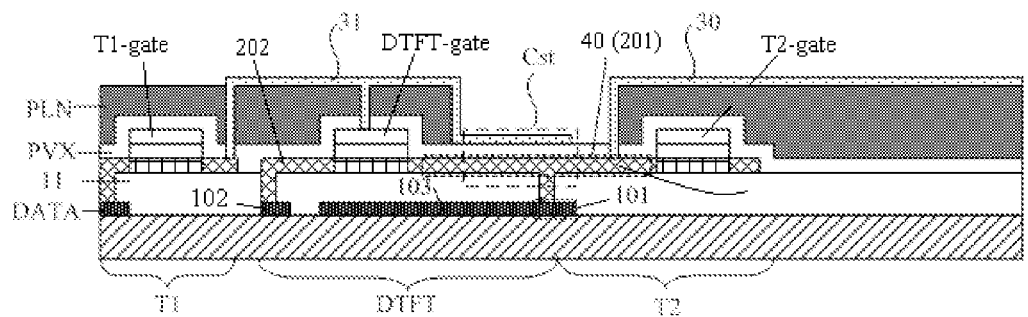
FIG. 5 is a cross-sectional view of an array substrate corresponding to the pixel driving circuit as shown in FIG. 4 according to an embodiment of the present disclosure.

In one embodiment, the thin film transistor 01 of the foregoing embodiments may be used as the driving transistor DTFT, the drain electrode 202 of the thin film transistor 01 is connected to the drain signal line 102, and the source electrode 201 is connected to the first electrode 30 of the organic light emitting diode (OLED) (referring to FIG. 5).

It should be noted that the thin film transistor 01 provided in the present disclosure can be applied as a driving transistor DTFT in any pixel driving circuit. In the following description, in an embodiment of a pixel driving circuit including a driving transistor DTFT, the driving transistor DTFT is implemented by the thin film transistor 01 as shown in FIG. 3.

As shown in FIG. 4 and FIG. 5 (which is a schematic cross section view of the pixel driving circuit in FIG. 4), the pixel driving circuit may further include a first switching transistor T1, a second switching transistor T2, and a storage capacitor Cst, in addition to the foregoing driving transistor DTFT and an organic light emitting diode (OLED) connected to the source electrode of the driving transistor DTFT.

In this embodiment, the drain electrode of the first switching transistor T1 is connected to the data line DATA, the source electrode of the first switching transistor T1 is connected to the gate electrode of the driving transistor DTFT, and the gate electrode of the first switching transistor T1 is connected to a first gate line G1 (as shown in FIG. 4).

The gate electrode of the second switching transistor T2 is connected to a second gate line G2, the source electrode of the second switching transistor T2 is connected to a sensing signal line, and the drain electrode of the second switching transistor T2 is connected to the source electrode of the driving transistor DTFT (as shown in FIG. 4).

One end of the storage capacitor Cst is connected to the gate electrode of the driving transistor DTFT, and the other end of the storage capacitor Cst is connected to the source electrode 201 of the driving transistor DTFT (as shown in FIGS. 4 and 5).

Those skilled in the art should understand that all thin film transistors in the pixel driving circuit can be fabricated by a same process, that is, the same components (including conductive parts and non-conductive parts) of all the thin film transistors can be processed and manufactured by a single patterning process.

In one embodiment, the source electrode, the drain electrode, and the active layer of the first switching transistor T1 and those of the second switching transistor T2 are respectively located in the same layer and made of the same material as the source electrode, the drain electrode, and the active layer of the driving transistor DTFT, that is, they are fabricated by a single patterning process. The gate electrodes of the first switching transistor T1 and the second switching transistor T2 are both located in the same layer and made of the same material as the gate electrode of the driving transistor DTFT, that is, they are manufactured by a single patterning process.

It should be noted that, in the present disclosure, the patterning process may include a photolithography process, or include a photolithography process and an etching process, and may further include other processes for fabricating a predetermined pattern, such as a printing process, an ink jetting process, and the like; the photolithography process refers to a process of forming a pattern by using a photoresist, a mask, an exposure machine, or the like, including processes of film formation, exposure, and development.

Further, it should be understood that, as for a bottom-emitting OLED display device (with higher requirements for shielding the channel position of the driving transistor from light), referring to FIG. 5, the first electrode 30 of the organic light emitting diode (OLED) connected to the source electrode 201 of the driving transistor DTFT is a transparent electrode and is generally made of a transparent conductive material such as indium tin oxide (ITO), indium zinc oxide (IZO), or the like.

In one embodiment, as shown in FIG. 5, a connection portion 31 connecting the source electrode of the first switching transistor T1 and the gate electrode of the driving transistor DTFT may be disposed in the same layer and made of the same material as the first electrode 30, that is, both the connection portion 31 and the first electrode 30 are fabricated through a single patterning process to simplify manufacturing process and reduce cost in the embodiment.

In one embodiment, as shown in FIG. 5, the source electrode of the driving transistor DTFT is connected to the light shielding pattern 103 through the source signal line 101 (generally, the source signal line 101 and the light shielding pattern 103 are disposed as an integral structure), thereby avoiding the light shielding pattern 103 from being in a floating state.

In this embodiment, the source electrode of the driving transistor DTFT and the drain electrode of the second switching transistor T2 are disposed as an integral electrode 40, and the integral electrode 40 is connected to the first electrode 30, such that the process can be simplified while reducing electric resistance. In this case, in order to further simplify the process, the above-described connection portion 31 may be extended to position facing the integral electrode 40 so that the storage capacitor Cst may be formed by the connection portion 31 and the integral electrode 40.

It should be understood here that as for the array substrate, after the gate electrode of the thin film transistor is fabricated, a passivation layer PVX and a planarization layer PLN (which may also be formed as a resin layer) may be sequentially formed as required as shown in FIG. 5, and then a transparent conductive pattern layer including the first electrode 30 and the connection portion 31 described above is formed.

In one embodiment, as shown in FIG. 5, a data line DATA connected to the source electrode of the first switching transistor T1 is located in the same layer and made of the same material (that is, formed through a single patterning process) as the light shielding pattern 103 of the driving transistor DTFT, thereby simplifying the process.

Figure 6:
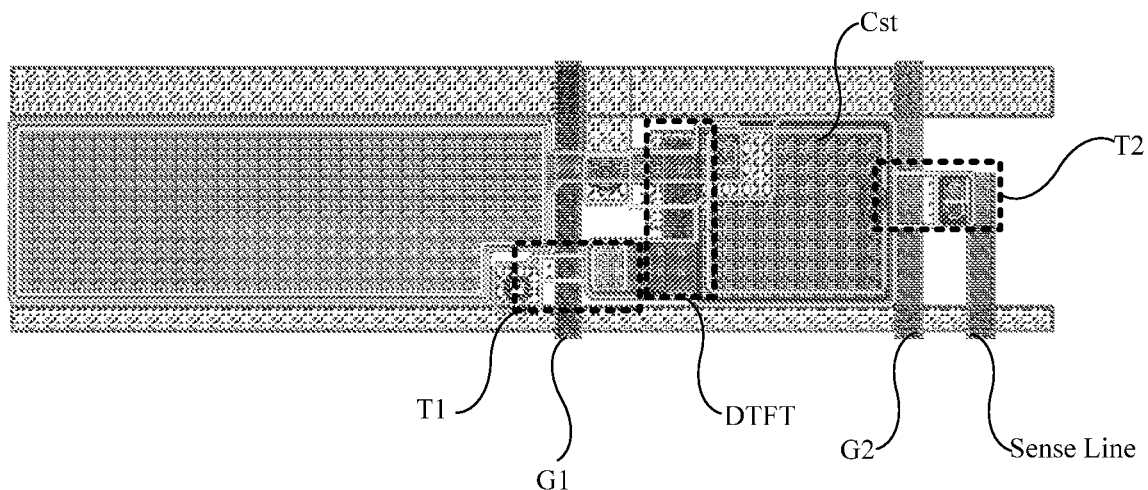
FIG. 6 is a schematic diagram of a layout design corresponding to the pixel driving circuit shown in FIG. 4 and FIG. 5 according to an embodiment of the present disclosure.

In one embodiment, referring to the planar layout design (of the pixel driving circuit of FIG. 4 and FIG. 5) of FIG. 6, the first gate line G1, the second gate line G2, and the sensing signal line Sense Line are disposed in the same layer and made of the same material (that is, formed through a single patterning process) as the gate electrode of the driving transistor DTFT (referring to FIG. 5), thereby simplifying the process.

Figure 7A:
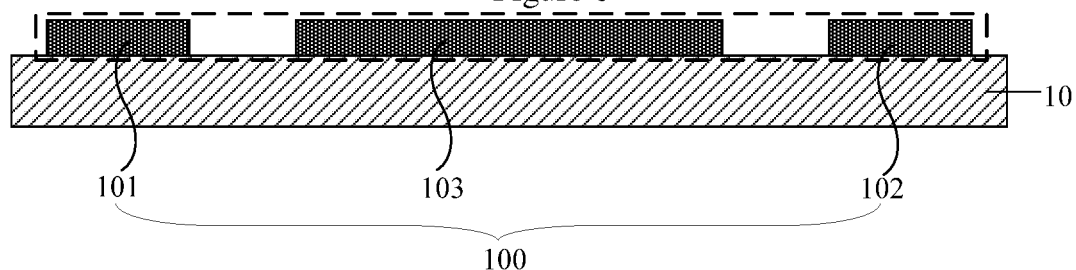
FIG. 7a is a schematic diagram of a part of a manufacturing process of a thin film transistor according to an embodiment of the present disclosure.
Figure 7B:
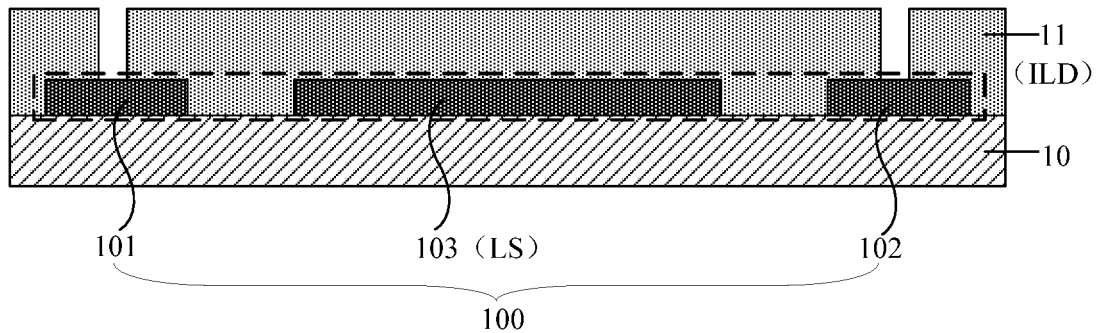
FIG. 7b is a schematic diagram of a part of a manufacturing process of a thin film transistor according to an embodiment of the present disclosure.
Figure 7C:
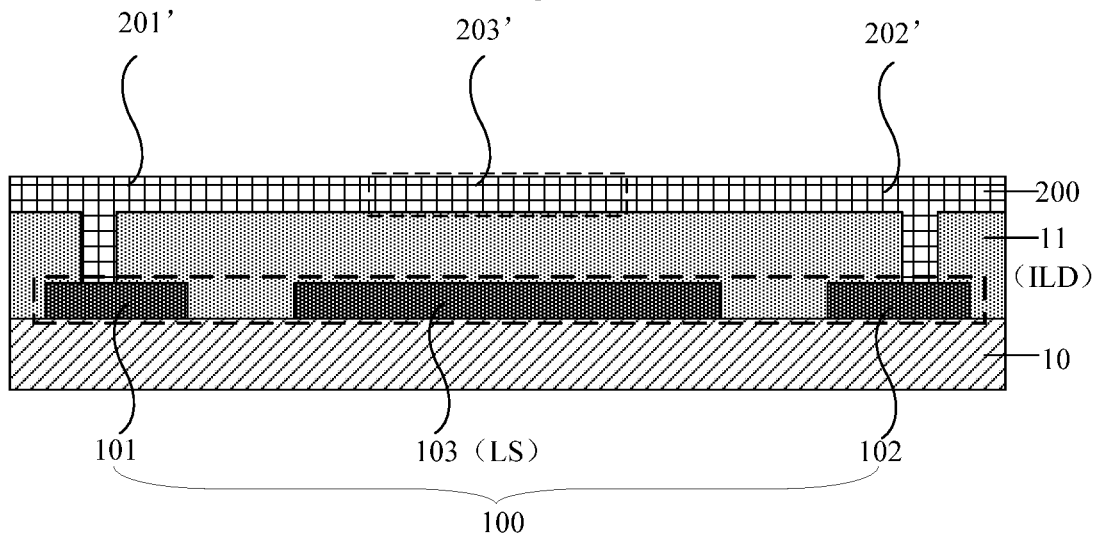
FIG. 7c is a schematic diagram of a part of a manufacturing process of a thin film transistor according to an embodiment of the present disclosure.
Figure 7D:
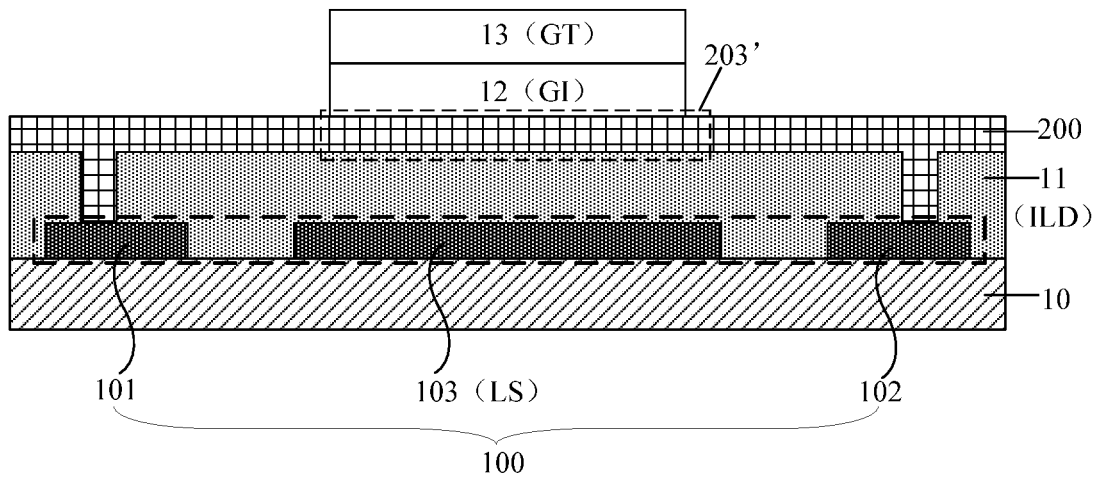
FIG. 7d is a schematic diagram of a part of a manufacturing process of a thin film transistor according to an embodiment of the present disclosure.
Figure 7E:
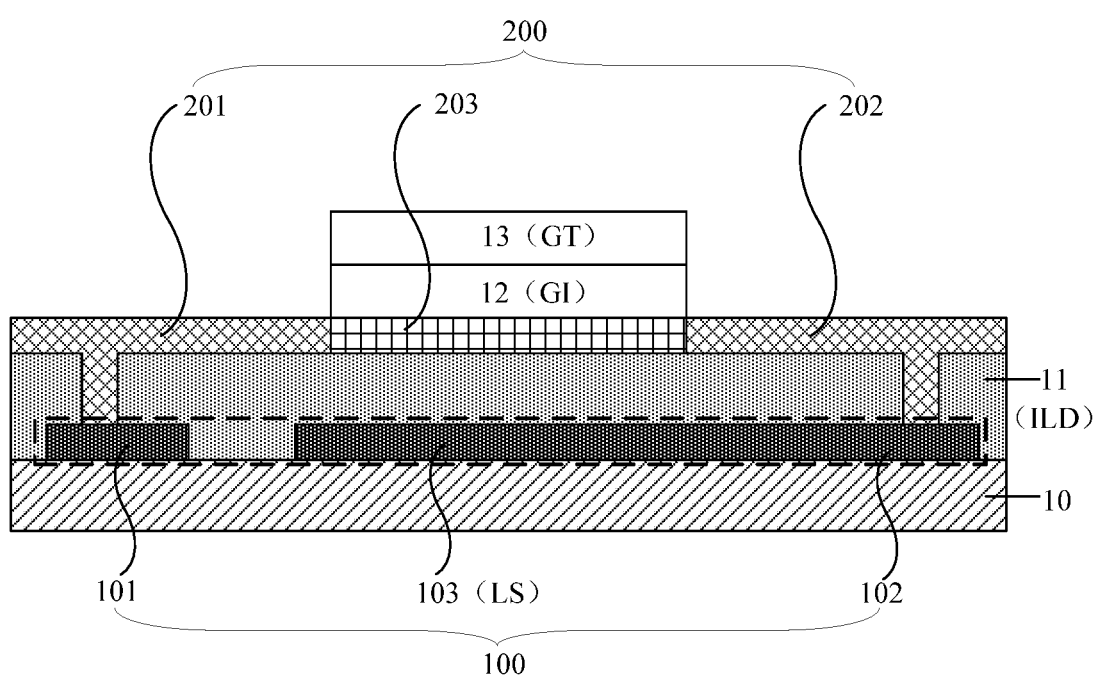
FIG. 7e is a schematic diagram of a part of a manufacturing process of a thin film transistor according to an embodiment of the present disclosure.
Figure 8:
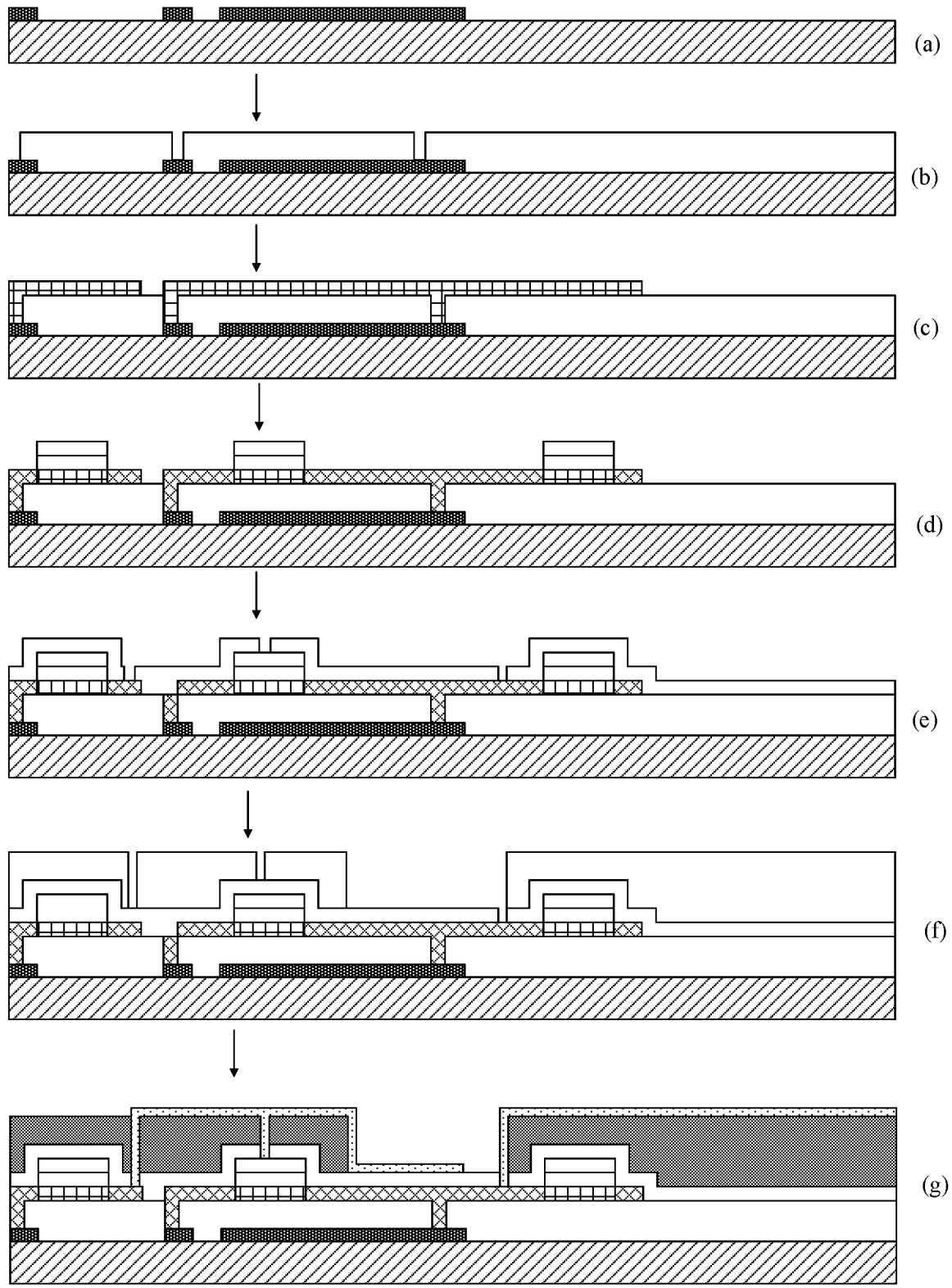
FIG. 8 is a schematic diagram of a manufacturing process of an OLED array substrate according to an embodiment of the present disclosure.

Embodiments of the present disclosure further provide a method for fabricating a thin film transistor, the method comprising:

step S101, referring to FIG. 7a, forming a metal conductive pattern layer 100 on a base substrate 10 by a patterning process, the metal conductive pattern layer 100 including: a light shielding pattern 103, and a source signal line 101 to be connected to a source electrode 201 (not shown) and/or a drain signal line 102 to be connected to a drain electrode 202 (not shown);

step S102, referring to FIG. 7b, forming an interlayer insulating layer 11 on the base substrate 10 on which the metal conductive pattern layer 100 is formed; wherein a via hole is formed at a position of the interlayer insulating layer 11 corresponding to the source signal line 101 and/or the drain signal line 102 so that the source electrode 201 subsequently formed is connected to the source signal line 101, and the drain electrode 202 subsequently formed is connected to the drain signal line 102;

step S103, referring to FIG. 7c, forming a metal oxide layer 200 on the base substrate 10 on which the interlayer insulating layer 11 is formed; the metal oxide layer includes a source electrode region 201', a drain electrode region 202', and an active region 203' located between the source electrode region 201' and the drain electrode region 202' and being in direct contact with them; and a portion of the metal oxide layer 200 located in the source electrode region 201' penetrates (generally through a via) the interlayer insulating layer 11 to connect to the source signal line 101, and/or a portion of the metal oxide layer 200 located in the drain electrode region 202' penetrates through the interlayer insulating layer 11 to connect to the drain signal line 102, and an orthographic projection of the portion of the metal oxide layer 200 in the active region 203' on the base substrate 10 has an overlapping region with an orthographic projection of the light shielding pattern 103 on the base substrate 10;

step S104, referring to FIG. 7d, a gate insulating layer 12 and a gate electrode 13 are sequentially formed at a position of the metal oxide layer 200 corresponding to the active region 203';

step S105, referring to FIG. 7e, on the base substrate 10 on which the gate electrode 13 is formed, the source electrode region and the drain electrode region of the metal oxide layer 200 are subjected to a conductor transforming process by a plasma treatment so that the portion of the metal oxide layer corresponding to the source electrode region constitutes the source electrode 201, the portion of the metal oxide layer corresponding to the drain electrode region constitutes the drain electrode 102, and an active region constitutes the active layer 103.

Certainly, for other related content in the manufacturing method, the corresponding content in the foregoing description for the embodiments of the thin film transistor may be referred such that the mask may be correspondingly adjusted, or an appropriate manufacturing process may be selected, which will not be described herein again in detail.

In addition, the related method of manufacturing the OLED array substrate (as shown in FIG. 5) in the foregoing embodiments of the array substrate may be implemented in conjunction with FIG. 8(a)-8(g), by referring to the above-mentioned method of manufacturing the thin film transistor, by adjusting a shape and the like of a corresponding mask according to actual structure and combining other related fabricating process and material, which will not be described here. Of course, as for the OLED array substrate, other additional manufacturing steps are generally included after step (g), such as a step of the pixel-defining layer PDL and the like related are fabricated, which will not be repeated here.

The above is only the specific embodiments of the present disclosure, but the scope of the present disclosure is not limited thereto, and any person skilled in the art can easily think of changes or substitutions within the technical scope of the disclosure. It should be covered within the scope of protection of the present disclosure. Therefore, the scope of protection of the present disclosure should be defined by the claims

The invention claimed is:

1. An array substrate, the array substrate is an OLED array substrate; and a sub-pixel of the array substrate includes a pixel driving circuit, wherein the pixel driving circuit comprises:
   a driving transistor, and an organic light emitting diode connected to a source electrode of the driving transistor; and a drain electrode of the driving transistor is connected to a drain signal line, and the source electrode of the driving transistor is connected to a first electrode of the organic light emitting diode;
   a first switching transistor, a second switching transistor, and a storage capacitor, wherein a drain electrode of the first switching transistor is connected to a data line, a source electrode of the first switching transistor is connected to a gate electrode of the driving transistor, and a gate electrode of the first switching transistor is connected to a first gate line; a gate electrode of the second switching transistor is connected to a second gate line, a source electrode of the second switching transistor is connected to a sensing signal line, and a drain electrode of the second switching transistor is connected to the source electrode of the driving transistor; one end of the storage capacitor is connected to the gate electrode of the driving transistor, and the other end is connected to the source electrode of the driving transistor, wherein the source electrode of the first switching transistor is connected to the gate electrode of the driving transistor through a connection portion, wherein the first electrode is a transparent electrode; and the connection portion is made of a same material and located in a same layer as the first electrode.

2. The array substrate of claim 1, wherein the driving transistor is a thin film transistor comprising: a metal conductive pattern layer disposed on a base substrate; and an interlayer insulating layer, a metal oxide layer, a gate insulating layer, and the gate electrode, which are sequentially disposed on the base substrate having the metal conductive pattern layer;

wherein the metal conductive pattern layer includes: a light shielding pattern, a source signal line, and/or the drain signal line;

the metal oxide layer includes the source electrode, the drain electrode, and an active layer between the source electrode and the drain electrode and being in direct contact with the source electrode and the drain electrode;

an orthographic projection of the active layer on the base substrate has an overlapping region with an orthographic projection of the light shielding pattern on the base substrate; and the source electrode extends through the interlayer insulating layer to connect to the source signal line, and/or the drain electrode extends through the interlayer insulating layer to connect to the drain signal line.

3. The array substrate of claim 2, wherein the source electrode, the drain electrode, and an active layer of the first switching transistor and the source electrode, the drain electrode, and an active layer of the second switching transistor are respectively made of a same material and located in a same layer as the source electrode, the drain electrode, and the active layer of the driving transistor; and the gate electrode of the first switching transistor and the gate electrode of the second switching transistor are both made of a same material and located in a same layer as the gate electrode of the driving transistor.

4. The array substrate as claimed in claim 2, wherein the source electrode of the driving transistor is connected to the light shielding pattern through the source signal line;

the source electrode of the driving transistor and the drain electrode of the second switching transistor constitute an integral electrode, and the integral electrode is connected to the first electrode; and the connection portion extends to a position facing the integral electrode to form the storage capacitor with the integral electrode.

5. The array substrate as claimed in claim 3, wherein the data line is located in a same layer and made of a same material as the light shielding pattern of the driving transistor; and/or the first gate line, the second gate line, and the sensing signal line are located in a same layer and made of a same material as the gate electrode of the driving transistor.

6. The array substrate as claimed in claim 4, wherein an orthographic projection of the connection portion on the base substrate covers the orthographic projection of the light shielding pattern on the base substrate.

7. The array substrate as claimed in claim 3, wherein a passivation layer and a planarization layer are sequentially provided on a side of the gate electrode of the first switching transistor, the gate electrode of the second switching transistor and the gate electrode of the driving transistor away from the base substrate, and the source electrode of the first switching transistor and the gate electrode of the driving transistor are connected by the connection portion through via holes in the passivation layer and the planarization layer.

8. The array substrate as claimed in claim 2, wherein the orthographic projection of the light shielding pattern on the base substrate covers the orthographic projection of the active layer on the base substrate.

9. The array substrate as claimed in claim 2, wherein the light shielding pattern is connected to the source signal line; or the light shielding pattern is connected to the drain signal line.

10. The array substrate as claimed in claim 2, wherein the active layer is made of a metal oxide constituting the metal oxide layer, and the source electrode of the driving transistor and the drain electrode of the driving transistor include a metal that is transformed from the metal oxide by a conductor transforming process.

* * * * *